(12) United States Patent
Clarke et al.

(10) Patent No.: US 8,008,936 B2
(45) Date of Patent: Aug. 30, 2011

(54) PROBE CARD ACTUATOR

(75) Inventors: James A. Clarke, Santee, CA (US); John Thomas Josefosky, San Diego, CA (US); Michael A. Larkin, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 191 days.

(21) Appl. No.: 12/270,738

(22) Filed: Nov. 13, 2008

(65) Prior Publication Data

US 2010/0117669 A1    May 13, 2010

(51) Int. Cl.
*G01R 31/02* (2006.01)
(52) U.S. Cl. .................................. 324/754.11
(58) Field of Classification Search .......................... None
See application file for complete search history.

(56) References Cited

U.S. PATENT DOCUMENTS

| | | | |
|---|---|---|---|
| 5,471,148 A * | 11/1995 | Sinsheimer et al. | 324/754 |
| 6,049,217 A | 4/2000 | Viswanath et al. | |
| 6,091,253 A | 7/2000 | Huang | |
| 6,373,268 B1 * | 4/2002 | Dunlap et al. | 324/755 |
| 6,377,062 B1 | 4/2002 | Ramos et al. | |
| 6,600,334 B1 * | 7/2003 | Hembree et al. | 324/765 |
| 7,049,837 B2 * | 5/2006 | Kasukabe et al. | 324/754 |
| 7,365,553 B2 * | 4/2008 | Garabedian et al. | 324/750.22 |
| 7,728,612 B2 * | 6/2010 | Garabedian et al. | 324/756.03 |
| 7,759,952 B2 * | 7/2010 | Garabedian et al. | 324/756.03 |
| 2004/0070413 A1 * | 4/2004 | Kasukabe et al. | 324/754 |
| 2007/0167083 A1 | 7/2007 | Mineo | |
| 2008/0007281 A1 * | 1/2008 | Garabedian et al. | 324/754 |
| 2008/0211525 A1 * | 9/2008 | Garabedian et al. | 324/758 |

FOREIGN PATENT DOCUMENTS

WO    WO2006086512 A2    8/2006

OTHER PUBLICATIONS

International Search Report—PCT/US2009/064460—International Search Authority, European Patent Office, Mar. 25, 2010.

* cited by examiner

*Primary Examiner* — Jermele M Hollington
(74) *Attorney, Agent, or Firm* — William M. Hooks

(57) ABSTRACT

A probe card test interface is described. The probe card test interface includes a first frame configured to support a probe card circuit card assembly (CCA). The probe card CCA is configured to contact a semiconductor wafer with one or more test probes. The first frame is also configured to support a first group of electrical contact points, the first group of electrical contact points being electrically coupled to circuitry of the probe card CCA. A second frame is coupled to a test interface CCA, where the test interface CCA includes a second group of electrical contact points. A number of actuation devices are slidably mounted on the second frame. The actuation devices have a tip member configured to engage a lip of the first frame when the corresponding actuation device is moved to an engagement position. When all of the actuation devices are in the engagement position, simultaneous actuation of the actuation devices moves the first frame toward the second frame to couple the first and second groups of electrical contact points. The first group of electrical contact points is supported by the first frame such that the probe card CCA experiences little or no deflection during actuation of the actuation devices, thereby preventing damage to the probe card CCA.

20 Claims, 16 Drawing Sheets

PROBE CARD ACTUATOR

BACKGROUND

1. Field

This disclosure relates generally to apparatus for testing semiconductor wafers, and more specifically to a system, method and apparatus for coupling a universal test interface with a probe card system for testing with a wafer prober.

2. Related Art

In a wafer prober, a probe card is an interface between an electronic test system and a semiconductor wafer. The purpose of the probe card is to provide an electrical path between the test system and the circuits on the wafer, thereby permitting testing and validation of the circuits. Testing is typically done before the circuits are diced and packaged.

During development of a probe card, cables are manually connected to and/or removed from any of several access test points on the probe card. The probes of the probe card are connected to a test head. The cost of a test head of a probe card can be on the order of $10,000-$50,000 or more. Manually connecting cables can be time consuming and cumbersome. Additionally, manual connecting of cables can result in irreversible damage to the sensitive probes of the very expensive test head.

Hundreds or even thousands of access point are desirable in testing. It would be desirable to have a universal interface for connecting possibly thousands of pins simultaneously to an electrical interface of the probe card. These thousands of pins can be connected to electrical cables in order to transmit signals to and from the wafer prober machine to the semiconductor wafer. However, the force required to plug thousands of pins of a test pad into the thousands of holes of the electrode pad of a probe card can take hundreds of pounds of force. If the test head of the probe card is in contact with the wafer, the hundreds of pounds of force could easily damage the fragile probes of the test head.

BRIEF SUMMARY OF THE INVENTION

In one aspect, the disclosure includes a probe card test interface, the probe card test interface including a first frame configured to support a probe card circuit card assembly (CCA), the probe card CCA being configured to contact a semiconductor wafer with one or more test probes, the first frame being further configured to support a first group of electrical contact points, the first group of electrical contact point being electrically coupled to circuitry of the probe card CCA, where the first frame includes at least one lip. The probe card test interface further includes a second frame coupled to a test interface CCA, the test interface CCA including a second group of electrical contact points, and a plurality of actuation devices, the actuation devices being slidably mounted on the second frame, where the actuation devices have a tip member configured to engage the at least one lip of the first frame when the corresponding actuation device is moved to an engagement position. When the plurality of actuation devices are in the engagement position, actuation of the plurality of actuation devices moves the first frame toward the second frame to couple the first and second groups of electrical contact points.

In another aspect, the disclosure includes a method of probe testing a semiconductor wafer, the method including mounting a first frame on a wafer prober system, the first frame configured to support a probe card circuit card assembly (CCA), the probe card CCA being configured to contact a semiconductor wafer with one or more test probes, the first frame being further configured to support a first group of electrical contact points, the first group of electrical contact point being electrically coupled to circuitry of the probe card CCA, where the first frame includes at least one lip. The method further includes positioning a second frame on the first frame, the second frame being coupled to a test interface circuit card assembly, the interface circuit card assembly including a second group of electrical contact points, the second frame coupled to a plurality of actuation devices, the actuation devices being slidably mounted on the second frame, wherein the actuation devices comprise a tip member configured to engage the at least one lip of the first frame when the corresponding actuation device is moved to an engagement position. The method further includes moving each of the actuation devices into the engagement position and, when the plurality of actuation devices are in the engagement position, simultaneously actuating the plurality of actuation devices to move the first frame toward the second frame to couple the first and second groups of electrical contact points.

In still another aspect, the disclosure includes an apparatus for probe testing a semiconductor wafer, the apparatus including first supporting means for supporting a probe card circuit card assembly, the first supporting means further for supporting a first group of electrical contact points, the first group of electrical contact point being electrically coupled to circuitry of the probe card circuit card assembly (CCA), the probe card CCA being configured to contact a semiconductor wafer with one or more test probes. The apparatus further includes means for mounting the first supporting means on a wafer prober system, second supporting means for supporting a test interface circuit card assembly, the test interface circuit card assembly including a second group of electrical contact points. The apparatus further includes means for aligning the second supporting means with the first supporting means, and actuation means for releasably engaging the first supporting means and for moving the first supporting means toward the second supporting means to couple the first and second groups of electrical contact points.

BRIEF DESCRIPTION OF THE DRAWINGS

The features, objects, and advantages of aspects of the disclosure will become more apparent from the detailed description set forth below when taken in conjunction with the drawings, in which like elements bear like reference numerals.

DETAILED DESCRIPTION OF THE INVENTION

The word "exemplary" is used exclusively herein to mean "serving as an example, instance, or illustration." Any aspect described herein as "exemplary" is not necessarily to be construed as preferred or advantageous over other aspects.

Figure 1:
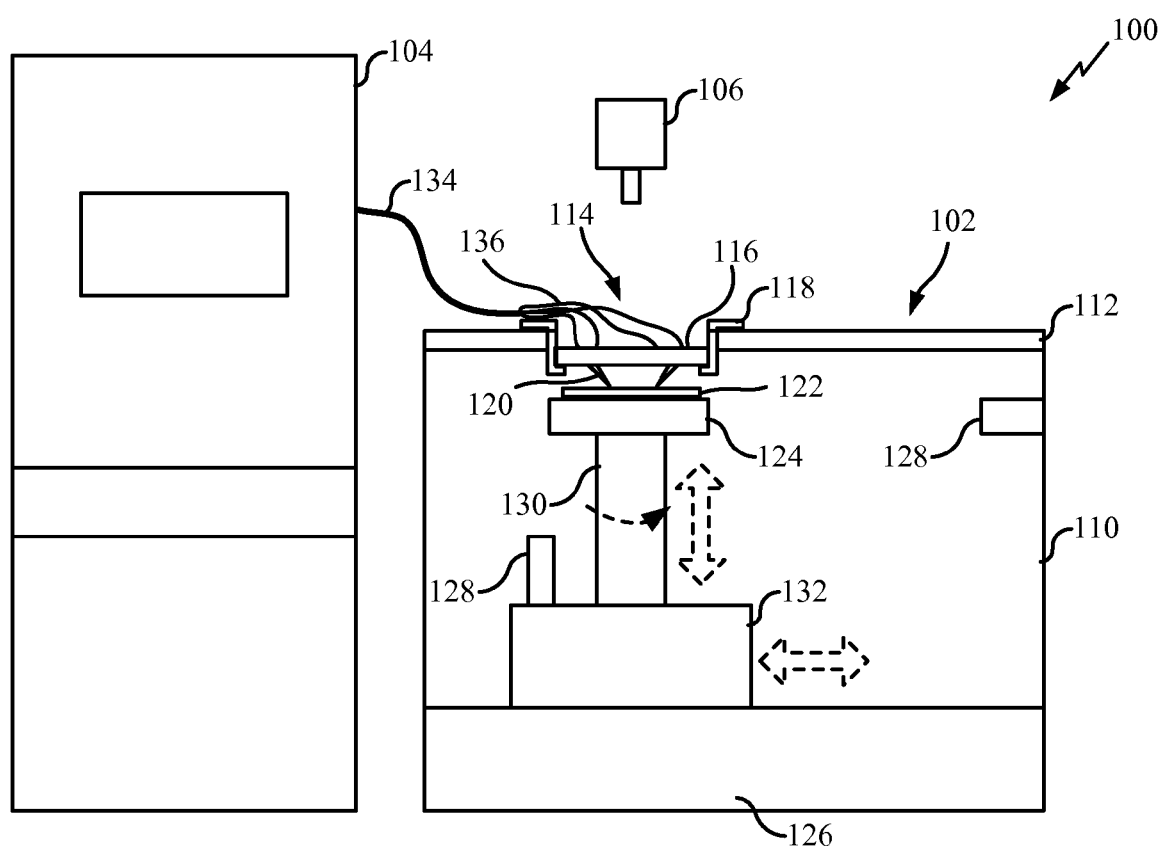
FIG. 1 is an illustration of a configuration of a wafer test system for testing semiconductor wafers.

FIG. 1 is an illustration of an example of a wafer test system 100 for testing semiconductor wafers. The wafer test system 100 includes a wafer prober 102, a tester unit 104 and a microscope 106. The wafer prober 102 includes a housing 110 that includes a test table 112. The test table 112 includes a cutout portion 114 for accepting a probe card 116. The probe card 116 is fastened to the test table 112 with a plurality of clamps 118. The clamps 118 serve to hold the probe card 116 in place during testing.

The probe card 116 includes a plurality of probes or fingers 120. The probes 120 are microscopic electronic contacts for making electrical contact with electronic leads of an integrated circuit (IC) on a wafer 122. The wafer 122 is held onto a wafer chuck 124, e.g., via vacuum pressure. The wafer chuck 124 is positioned by a position control system 126 such that the probes 120 contact electrical contacts of one of the integrated circuits (or two or more IC's in some cases) of the wafer 122.

The wafer chuck 124 is positioned by the position control system 126 using optical signals from two or more positioning cameras 128. The optical signals from the positioning cameras are used to locate the vertical position of the wafer and the horizontal position of the IC's on the wafer 122, both in relation to the probes 120. The vertical position and rotation of the wafer 122 are positioned by a z-movement and rotation unit 130. The horizontal locations, in x and y directions, are controlled by an x-y-movement base 132. The motions of the z-movement and rotation unit 130 and the x-y-movement base 132 are controlled by the position control system 126.

The tester unit 104 can include signal processing systems to provide input to and receive feedback from the IC's of the wafer 122 via the probes 120. The tester unit 104 can monitor digital signals and/or analog signals, depending on the testing being done. The tester unit 104 receives signals from the probe card 116 via one or more cables 134 that include signal wires 136. The signal wires 136 are connected to contact points of the probe card 116, e.g., via a test interface.

The microscope 106 is used to examine the probe card and/or IC's on a wafer being tested. For example, the microscope 106 can be used to identify faults in IC's. The microscope 106 can be integrated to the wafer prober 102 and/or the tester unit 104.

The probe card 116 can include hundreds or even thousands of probes. Preferably, the probe card 116 includes a universal interface that includes I/O adapters with electrical contacts coupled to each of the probes such that the signal wires 136 can be connected to the probes. However, the forces required to connect I/O adapters to hundreds or thousands of pins could damage the microscopic probes of the probe card 116. The core socket of the probe card 116, that contains the probes 120, can be very expensive, e.g., $10,000 to $50,000 or more. Thus, an efficient and non-damaging apparatus and method for the attaching signal wires 136 to contact points of the probe card 116 is provided.

Figure 2A:
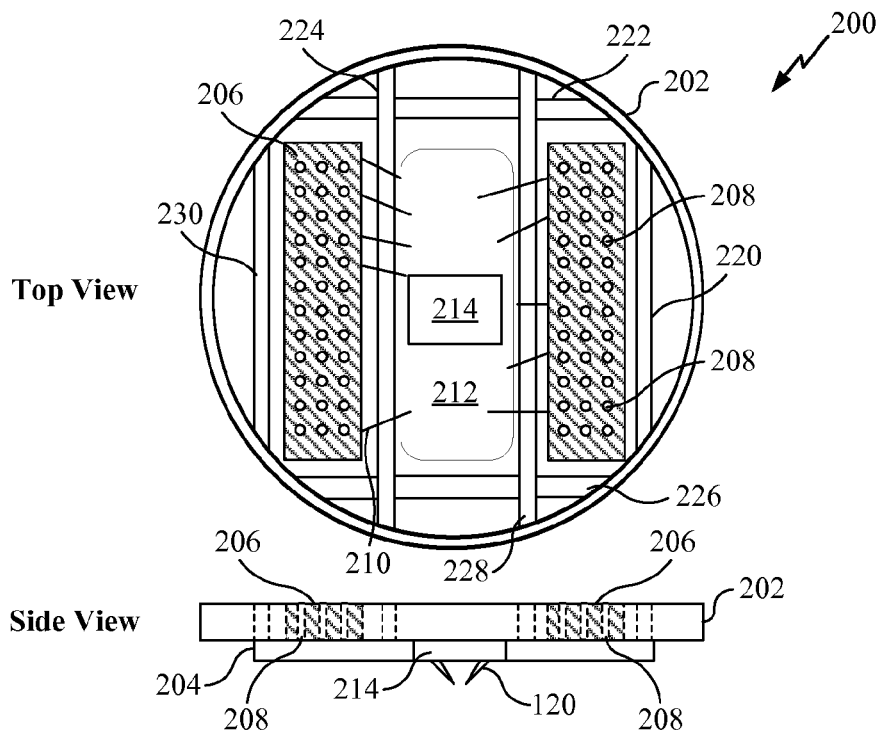
FIG. 2A is an illustration of top and side views of an example of a support frame that includes a universal interface coupled to a probe card.

FIG. 2A is an illustration of top and side views of an example of probe card system 200 including a support frame 202 supporting a circuit card assembly 204 that includes a universal interface coupled to a probe card assembly. The universal interface includes, in this example, two probe receptor blocks 206. The probe receptor blocks 206 include a plurality of contact points 208, e.g., female receptors for receiving probe needle contacts. The contact points 208 are electrically coupled, via electrical lines 210 of the circuit card assembly 204, to contact points within a probe card circuit area 212. The probe card circuit area 212 includes a core socket 214 that contains the probes 120 for testing IC's. In one embodiment, the probe receptor blocks 206 contain enough contact points to be electrically coupled to all the probes 120 of the core socket 214.

The frame 202 includes cross members 220-230. The cross members 220-230 are configured to isolate the probe receptor blocks 206 from the probe card circuit area 212 and especially from the core socket 214. The frame 202 is made of aluminum, but other materials can be used. It is desirable to isolate the probe receptor blocks 206 from the probe card circuit area 212 and the core socket 214 in order to protect these areas from damage during coupling with a test interface portion that mates with the probe receptor blocks 206. The cross members 220-230 can prevent the forces required to mate the probe receptor blocks 206 to probe needles of the test interface portion from moving and/or damaging the sensitive probe card circuit area 212 and especially the core socket 214. The circuit card assembly 204, including the core socket 214 (which can be a removable member) can be attached to the frame 202 and cross members 220-230 with any suitable connector such as screws, rivets, glue, etc.

Figure 2B:
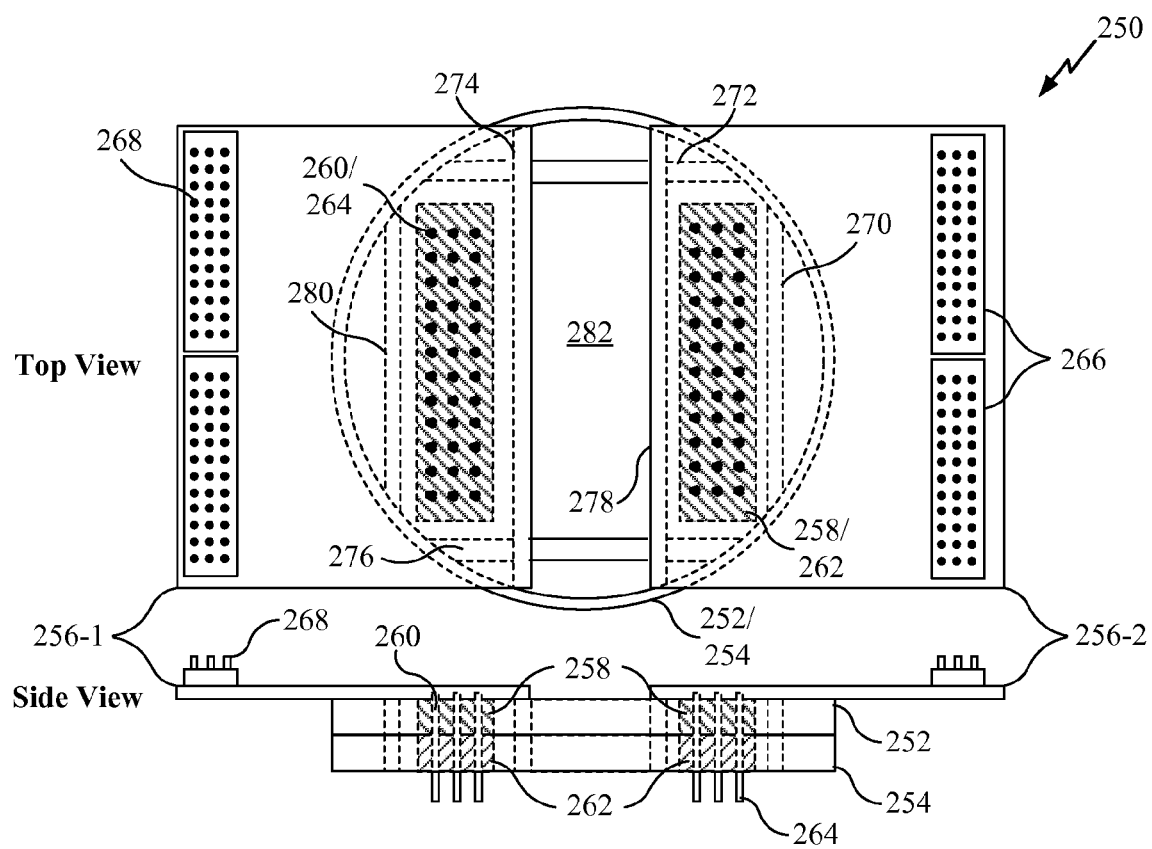
FIG. 2B is an illustration of top and side views of an example of a test interface for coupling with the universal interface of the probe card frame of FIG. 2A.

FIG. 2B is an illustration of top and side views of an example of a test interface 250 for coupling with the universal interface of the probe card frame of FIG. 2A. The test interface 250 includes an upper frame 252, a lower frame or probe tower 254 (referred to herein as probe tower), and circuit card assemblies 256-1 and 256-2. In an alternative embodiment, the circuit card assemblies 256-1 and 256-2 can be a single circuit card assembly.

The upper frame 252 contains two probe receptor blocks 258. The probe receptor blocks 258 can be the same type of receptor blocks as the probe receptor blocks 206 of the probe card system 200. The probe receptor blocks 258 include a plurality of contact points 260. The upper frame 252 is connected to the circuit card assemblies 256-1 and 256-2. The upper frame 252 and circuit card assemblies 256 can be connected via one or more of screws, rivets, glue, or other connectors. The upper frame 252 and circuit card assemblies 256 are aligned (e.g., via dowel pins) such that the contact points 260 are aligned with contact points on the circuit card assemblies 256.

The probe tower 254 contains two probe blocks 262. The probe blocks 262 contain dual sided spring loaded probe needles 264. The probe needles 264 include two springs (not shown) such that the upper needles (shown inserted into the probe receptor blocks 258) can be compressed independently from the lower ends of the probe needles 264. The number of spring loaded probe needles is the same as the number of contact points 260 in the probe receptor blocks 258.

The probe tower 254 and the upper frame 252 are shown in a connected state where they are connected by screws (not shown). The screws can be removed to separate the upper frame 252 and the probe tower 254 (e.g., to replace probe blocks 262 in case the probe needles 264 are damaged). When the upper frame 252 and the probe tower are in the connected state, the springs associated with the upper ends of the probe needles 264 are compressed and the probe needles 264 make electrical contact with the contact points 260 of the probe receptor blocks 258 and thus are also in electrical contact with contact points of the circuit card assembles 256.

The circuit card assemblies 256 include 4 I/O adapters 266. The I/O adapters 266 include many I/O pins 268. The I/O pins 268 are each connected, e.g., via electrical lines (not shown) in the circuit card assemblies 256, with one of the contact points 260 of the probe receptor blocks 258. Thus, the I/O pins 268 are also in electrical contact with the probe needles 264. In the example shown, there are twice as many I/O pins 268 as there are electrical contacts 260 and probe needles 264. In this way, two I/O pins can be electrically coupled with each of the contact points 260. This allows two test devices (e.g., two test units 104) to be coupled to the I/O adapters 266 such that two tests can be run simultaneously.

The frame 252 and probe tower 254 each include cross members 270-280. These cross members 270-280 support the probe receptor blocks 258 and the probe blocks 262. The cross members 272-278 define a void area 282. The void area 282 is provided to allow direct vision of the probe card circuit area 212 and the core socket 214 of the probe card system 200 when the probe card system 200 is mated to the test interface 250. In this way, the microscope 106 of the wafer prober system 100 can have a clear line of sight to the card circuit area 212 and the core socket 214.

The number of probe needles 264 is typically the same as the number of contact points 208 contained in the probe receptor blocks 206 of the probe card system 200. The frame 202 of the probe card system 200, the upper frame 252 and the probe tower 254 are manufactured to tolerances that allow the probe needles 264 to line up with the contact points 208 when the probe card system 200 and the test interface 250 are mated. To aid in the alignment, the probe tower 254 and/or the frame 202 of the probe card system 200 can have dowel pins and alignment holes.

When the probe card system 200 is mated with the test interface 250, the combined unit is attached to the test table 112 of the wafer prober 102. The combined unit can be attached via the clamps 118. The cable 134 can be attached to one or more of the I/O adapters 266 such that the tester unit 104 can provide test signals to and receive output signals from the probe card system 200.

The probe card system 200 and test interface 250 provide a way to allow simultaneous access to all the contact points of the probe card circuit area 212. However, mating the probe card system 200 and test interface 250 presents a challenge. A force needs to be provided between the probe card system 200 and test interface 250 in order to compress the spring loaded probe needles 264. This force can be quite substantial. For example, if there are 2000 probe needles 264, and each probe needle resists with a force of just two ounces, then a total force of 250 lbs. is sufficient to compress all 2000 probe needles. This can be accomplished by screwing the frame 202 of the probe card system 200 to the probe tower 254 of the test interface 250. However, it is desirable to be able to quickly couple and decouple the probe card system 200 from the test interface 250. A system providing quick coupling and decoupling, while not damaging the sensitive probe card system 200 is now discussed.

Figure 3:
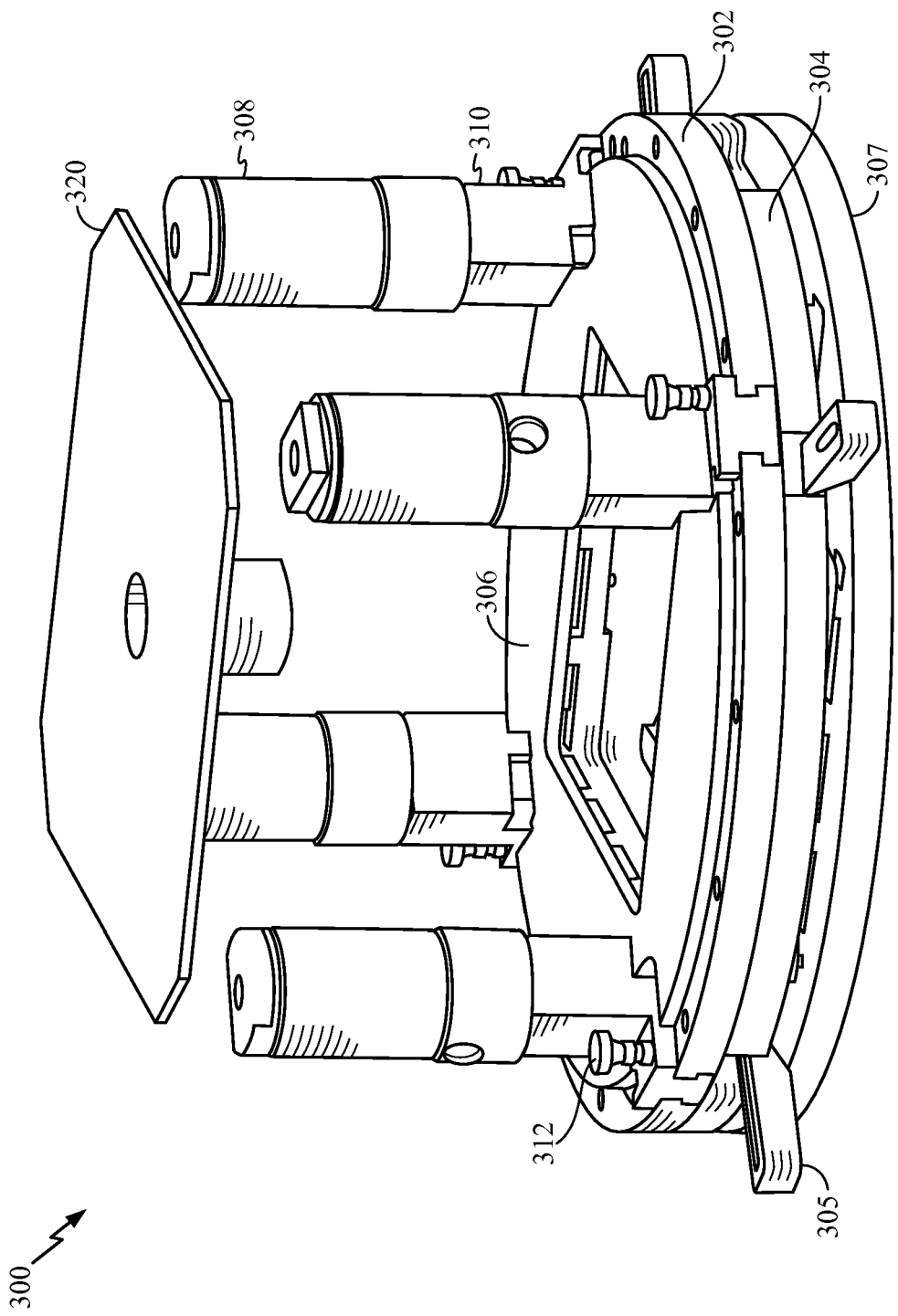
FIG. 3 is a perspective view of an example of a probe card actuator system for releasably coupling a probe card system with a test interface.
Figure 4:
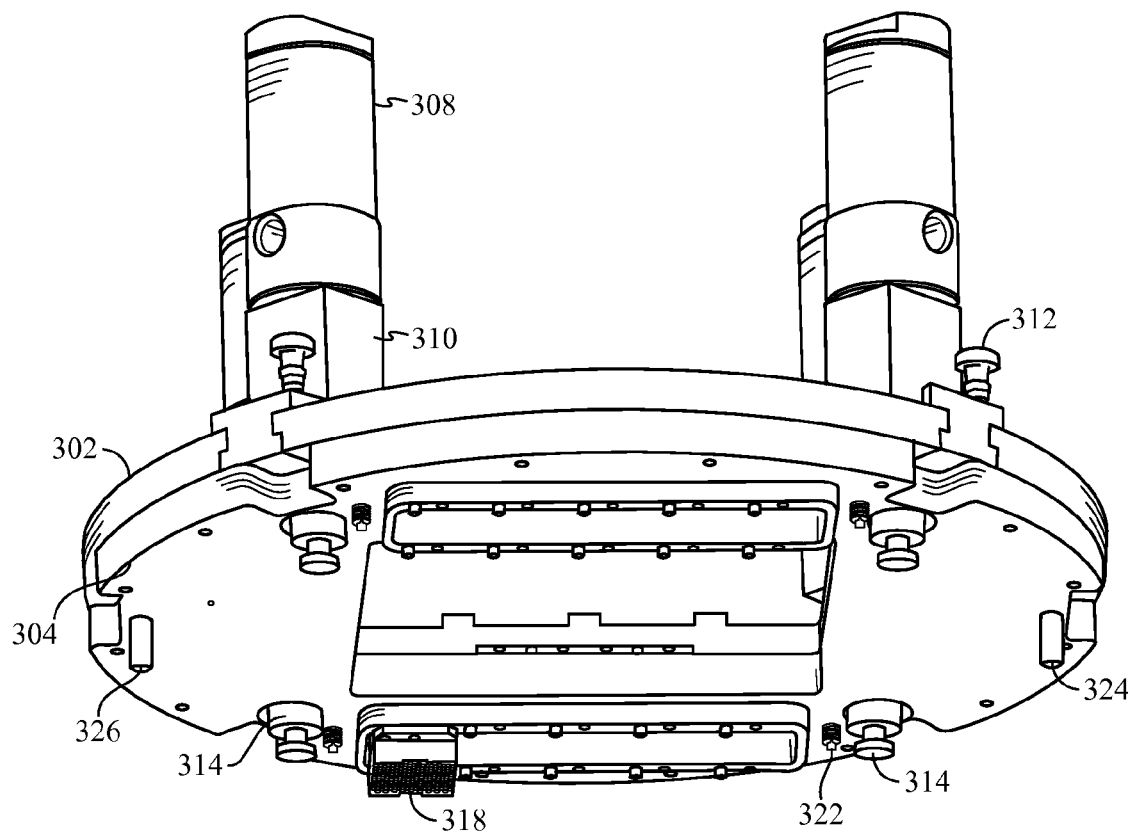
FIG. 4 is an underside perspective view of an example of an upper portion of the probe card actuator system of FIG. 3.
Figure 5:
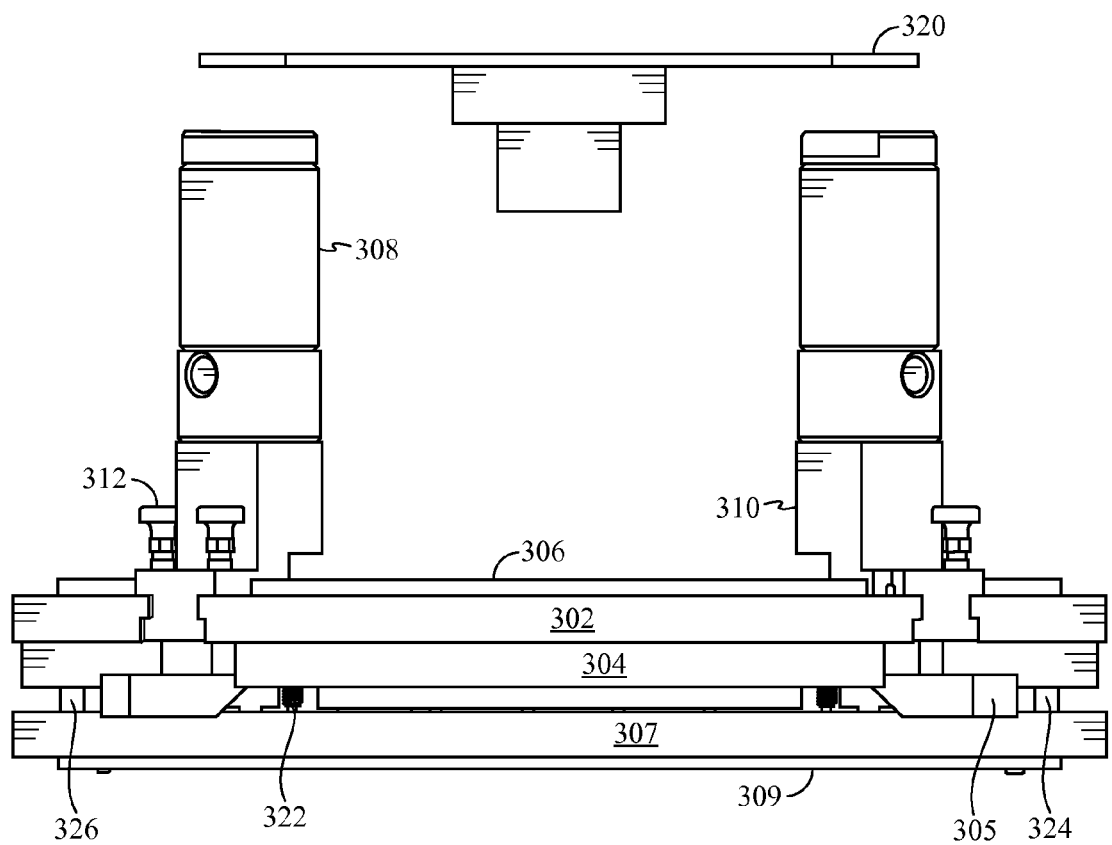
FIG. 5 is side view of the probe card actuator system of FIGS. 3-4.

FIGS. 3-5 are different views of an example of a probe card actuator system 300 (hereinafter actuator system 300) for releasably coupling a probe card system similar to the probe card system 200 with a test interface similar to the test interface 250. The actuator system 300 includes an interface portion including an upper frame 302, a probe tower 304, and a test interface CCA 306 attached to a top surface of the upper frame 302. The test interface CCA 306 is illustrated without side portions containing the I/O adapters 266 as shown in FIG. 2B. The test interface is attached to lower frame 307 that includes a probe card CCA 309 (see FIG. 5) similar to the probe card system 200 of FIG. 2. The actuator system 300 can be bolted with clamps 305 to a test surface such as the test table 112 of the wafer prober 102 of FIG. 1.

Figure 6B:
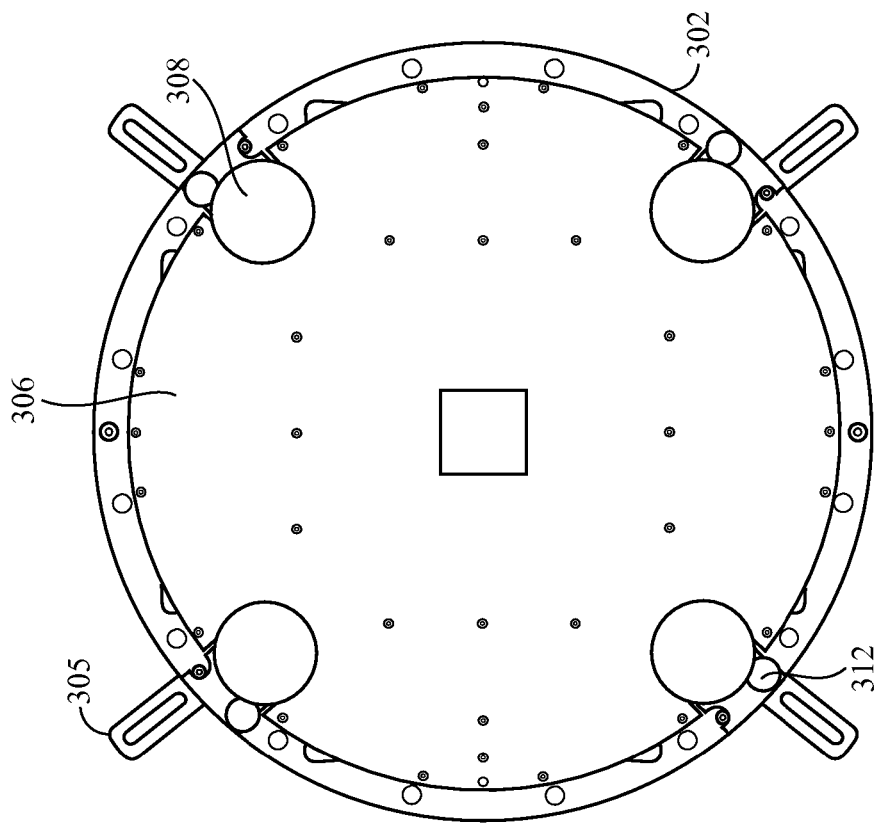
FIGS. 6A and 6B are top views of the probe card actuator system of FIGS. 3-5 with and without a microscope shield, respectively.
Figure 6A:
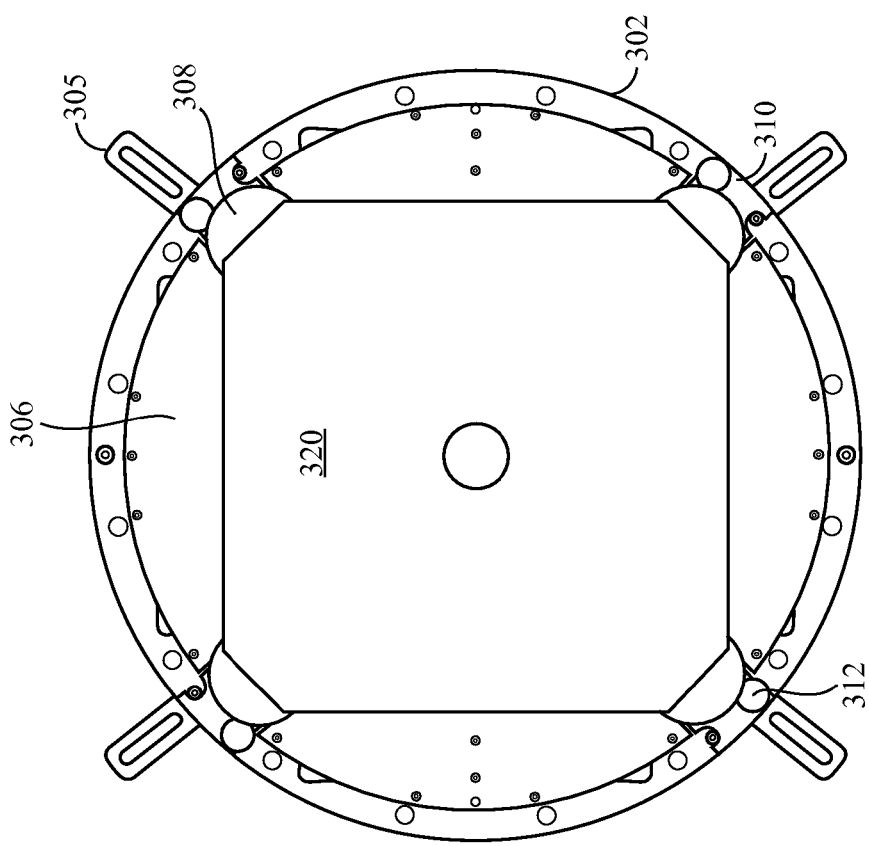

Also included in the actuator system 300 is a microscope light shield 320. The light shield 320 is used to block light from interfering with the optical qualities of a microscope being used to examine IC's on a wafer. The light shield 320 is configured to fit between the four actuation devices 308. FIGS. 6A and 6B are top views of the probe card actuator system of FIGS. 3-5 with and without the microscope light shield 320, respectively.

Figure 7:
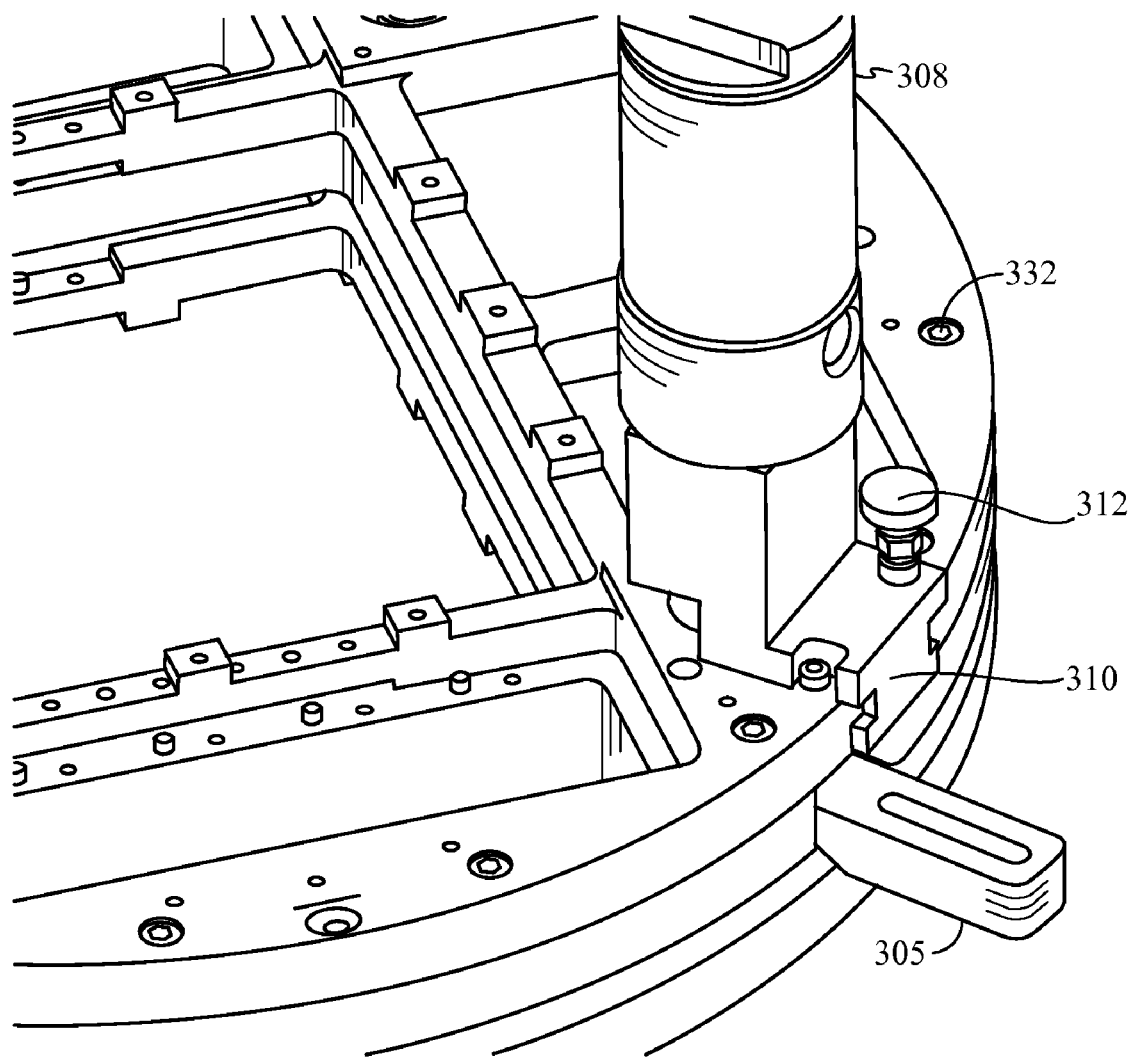
FIG. 7 is a perspective view of an actuator portion of the probe card actuator system of FIGS. 3-6.

The actuator system 300 also includes four actuation devices 308. The actuation devices can be air cylinder actuators, magnetic actuator, gas actuators, liquid actuators, etc. The actuation devices 308 are mounted on blocks 310 and the blocks 310 are slidably mounted in slots of the upper frame 302. The blocks 310 each include an internal extension spring that forces the blocks out radially. The blocks 310 each also include a spring loaded plunger 312. FIG. 7 is a perspective view of an air cylinder actuation portion of the probe card actuator system including the spring loaded lock plunger 312. FIG. 7 shows the block 310 in the unlocked or released position. The spring in the plunger pulls the plunger 312 down towards the probe tower 304. There is a hole in the probe tower 304 positioned slightly inward radially of the plunger, when the block 310 is released, such that when the block 310 is pushed inwards, the plunger 312 slides into the hole due to the spring of the lock plunger 312 and the block 310 is held in position. When the plunger 312 is pulled upwards, the block 310 is again forced outwards by the extension spring connected to the block 310.

FIG. 7 also shows bolts 332 used to couple the upper frame 302 to the probe tower 304. The bolts 332 provide the force to compress the upper spring loaded probe needles of the probe blocks 318. In this way, the actuators 308 are not required to provide the force to compress the upper probe needles of the probe blocks 308. This force can be substantial. For example, as discussed above, 2000 probe needles each resisting with a force of 2 ounces would resist with 250 lbs. of force.

Figure 11:
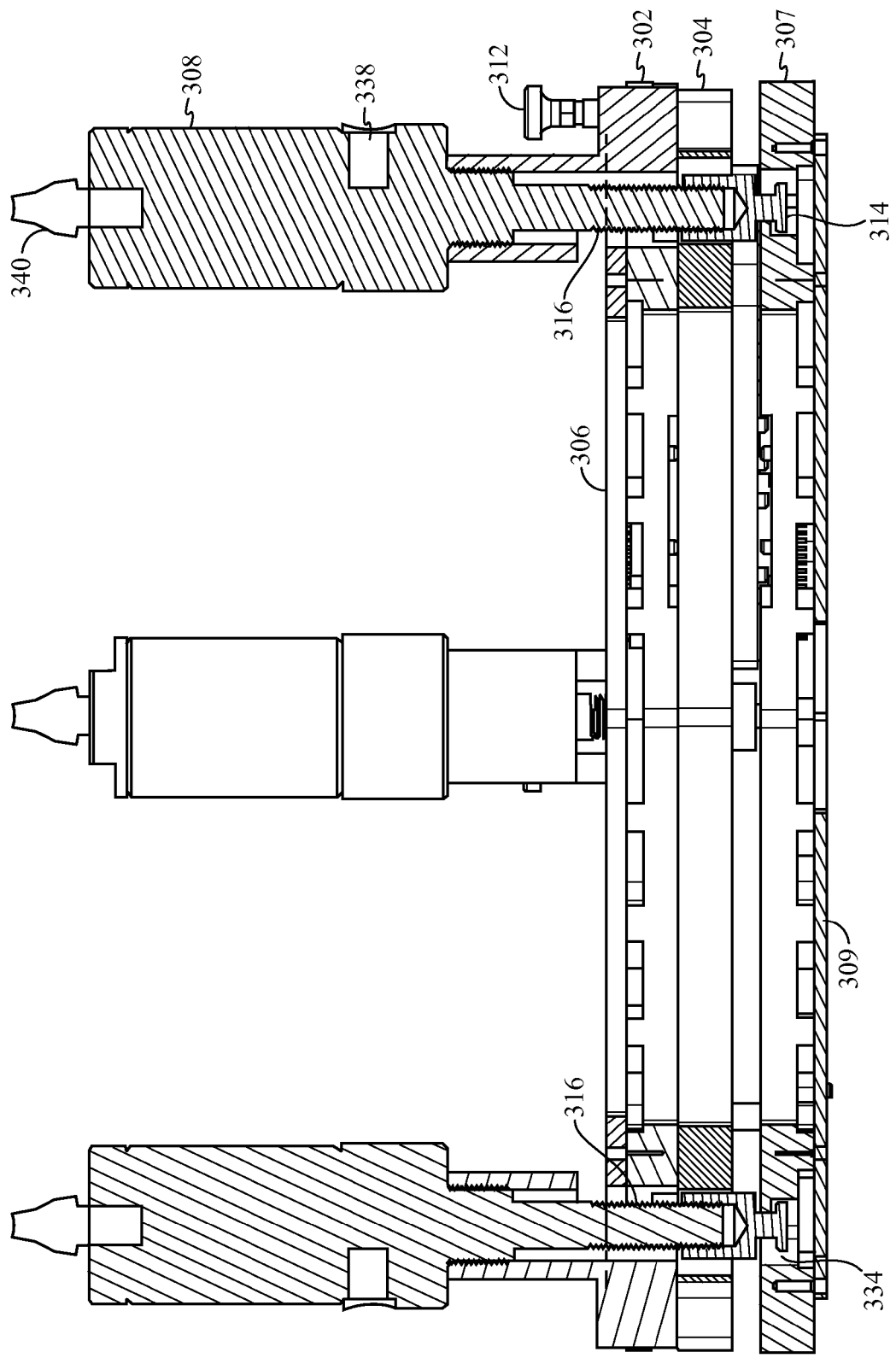
FIG. 11 is a cross sectional view through the centers of two actuators of the probe card actuation system of FIGS. 3-10.
Figure 12:
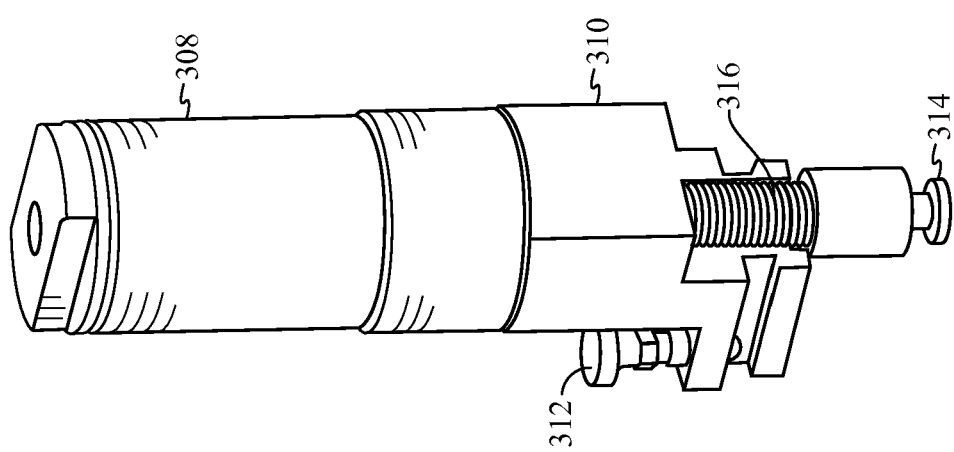
FIG. 12 is a perspective view of one of the actuators of the probe card actuation system of FIGS. 3-11.

Referring to FIGS. 11 and 12, the actuation devices 308 include a tip 314 that is attached to the cylinder rod 316 of the actuation device 308. The tip 314 is configured to engage a lip of the lower frame 307. The actuation devices 308 are configured to move the tips 314 upwards towards the upper frame 302, thereby pulling the lower frame 307 to couple the frame 302 and the probe tower to the lower frame 307. As discussed above, the upper frame 302 is electrically coupled via probe needles in probe blocks 318 in the probe tower 304 to electrical contacts in the lower frame 307. Only one probe block 318 is illustrated in FIG. 4, but 9 other probe blocks 318 are also included in the probe tower 304. Each probe block 318 includes 200 probe needles in this example, resulting in 2000 needles that couple electrical contacts in the upper CCA 306 to electrical contacts in the probe card CCA 309 of the lower frame 307.

As shown in FIG. 4, the probe tower 304 includes four support spring plungers 322 that contact the lower frame 307. The springs of the support spring plungers 322 are of sufficient strength to support the weight of the upper portions of the actuator system 300 on the lower frame 307 and preventing the needles of the probe blocks 318 from contacting the electrical contacts in the CCA of the lower frame 307 when the actuation devices 308 are not actuated to couple the lower frame 307 to the probe tower 304. In one embodiment, the support spring plungers 322 have a stiffness such that 11.1 lbs. of force will compress one of the support spring plungers 322. This stiffness is sufficient to support the upper portions of the actuator system while being low enough to not require significantly stronger actuators to compress.

The probe tower 304 also includes two dowel pins, a master dowel pin 324 and a secondary dowel pin 326. The dowel pins 324 and 326 slide into alignment holes formed in the lower frame 307. The alignment hole corresponding to the master dowel pin 324 is positioned with tolerances in both the x and y directions, while the alignment hole corresponding to the secondary dowel pin 326 need only have a fine tolerance in one dimension. In other words, the alignment hole for the master dowel pin includes a circle, and the alignment hole for the secondary dowel pin is an oblong slot. The dowel pins and alignment holes are designed to tolerances that allow the needles of the probe blocks 318 to align with and engage contact points in probe receptor blocks such as the probe receptor blocks 206 of the probe card system 200 of FIG. 2A. In one embodiment, the tolerance from the master dowel pin 324 to all probe locations is true position within 0.005 inches (+/−0.0025 inches). Alternatively, dowel pins can be located on the lower frame 307 and holes can be positioned on the probe tower 304.

Figure 8:
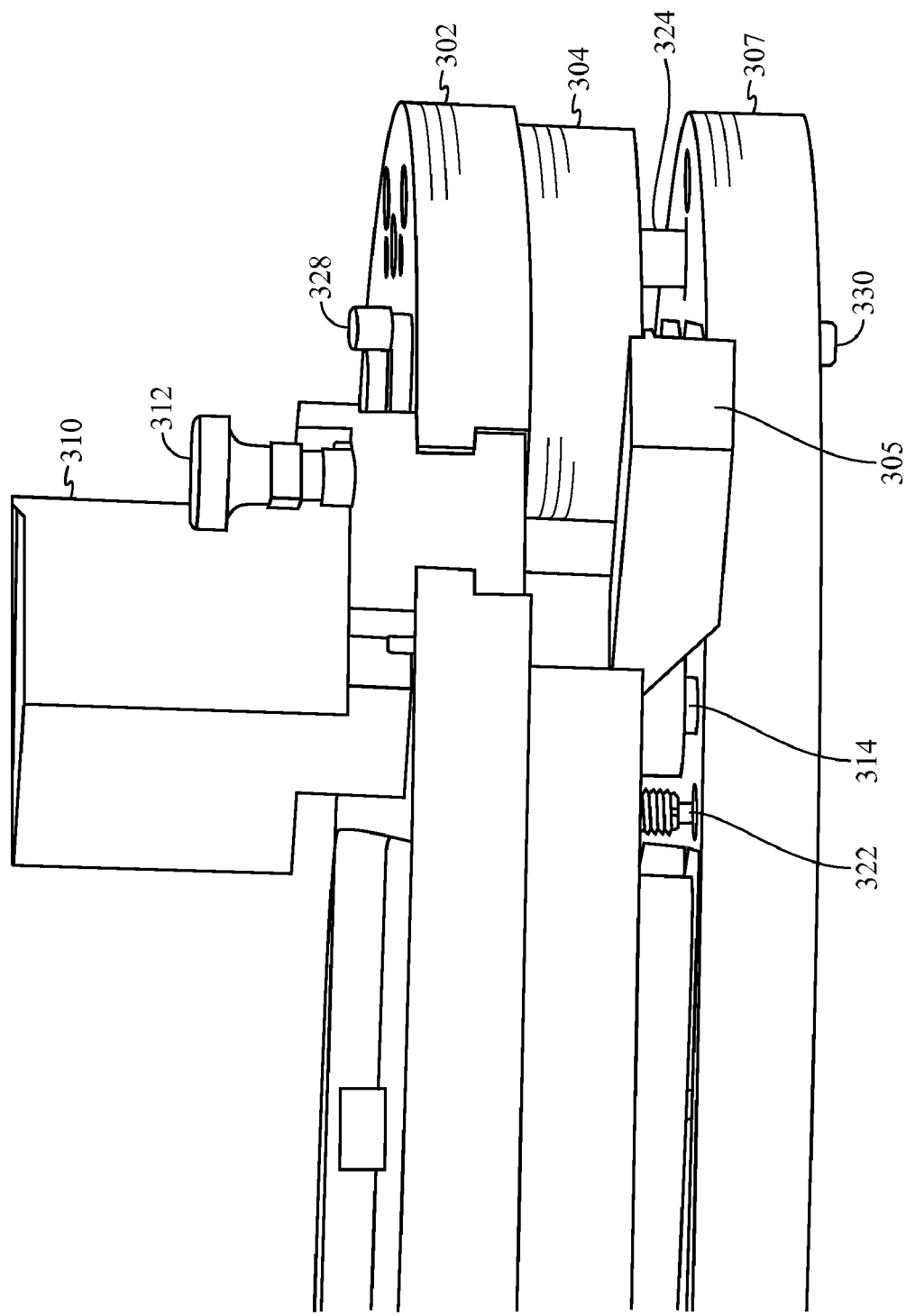
FIG. 8 is a side perspective view of the actuator portion of the probe card actuator system of FIGS. 3-7.

In addition to the dowel pins 324 and 326, the actuator system 300 includes at least two dowel pins 328 (one is illustrated in FIG. 8), including a master and one secondary dowel pin, on the upper frame 302 for aligning the test interface CCA 306. The lower frame 307 also includes two dowel pins 330 (one is illustrated in FIG. 8) including a master and one secondary dowel pin, for aligning the probe card CCA 309. The CCA's 306 and 309 include holes to receive the dowel pins 328 and 330. The upper and lower dowel pins 328 and 330 are toleranced to the probe tower and the master dowel pin 324 such that the combined tolerances of all the dowel pins 324, 326, 328 and 330, and the alignment holes in the CCA's 306 and 309 and the alignment holes in the lower frame 307 are small enough to allow the pins of the probe needles of the probe tower 304 to line up with the electrical contacts of the probe receptor blocks in both the test interface CCA 306 and the probe card CCA 309. Other alternative arrangements include having dowel pins located on the test interface CCA 306 and/or the probe card CCA 309 and having alignment holes located in the upper frame 302 and/or the lower frame 307, respectively.

Figure 9:
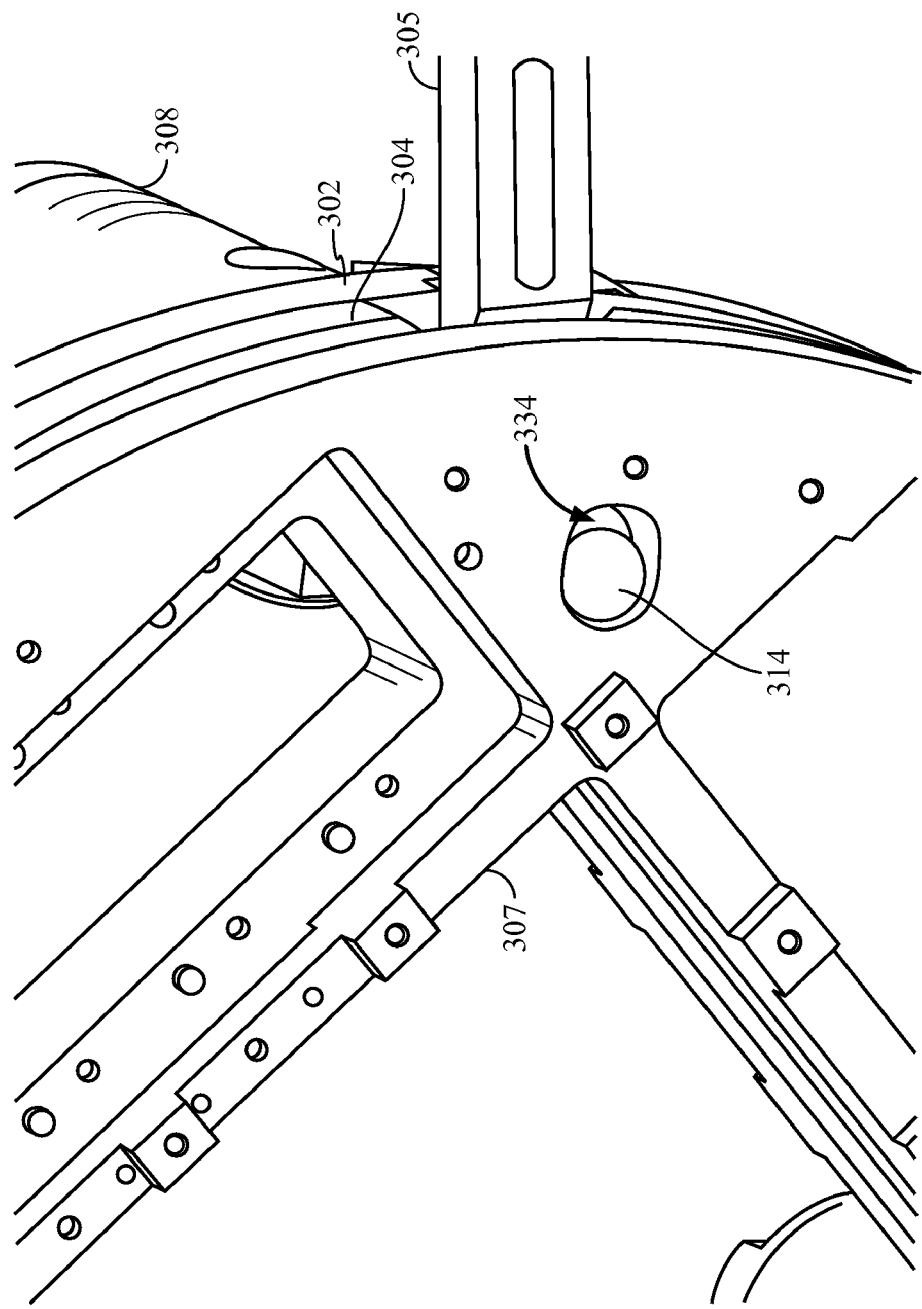
FIG. 9 is an underside perspective view of a tip of the actuator of the probe card actuation system of FIGS. 3-8 engaged with the probe card frame.
Figure 10:
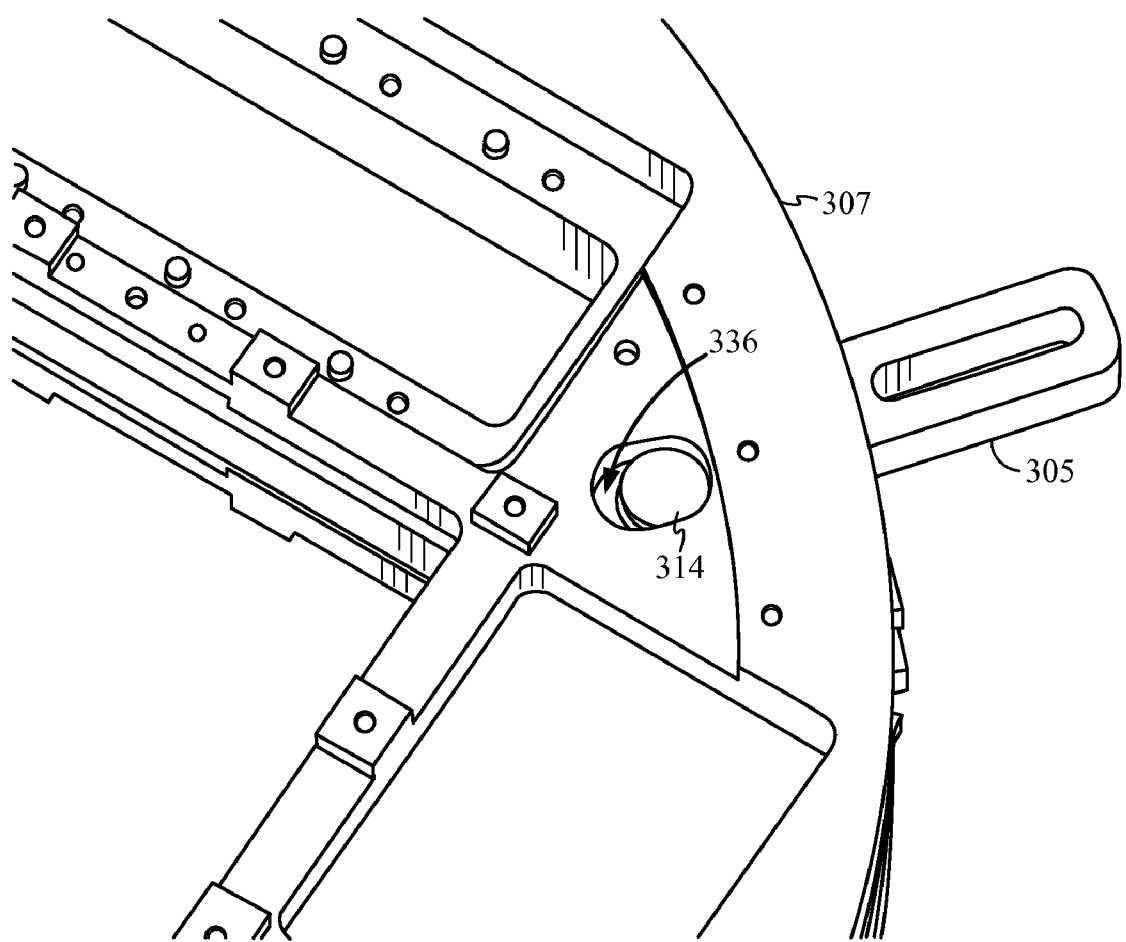
FIG. 10 is an underside perspective view of a tip of the actuator of the probe card actuation system of FIGS. 3-8 disengaged from the probe card frame.
Figure 13:
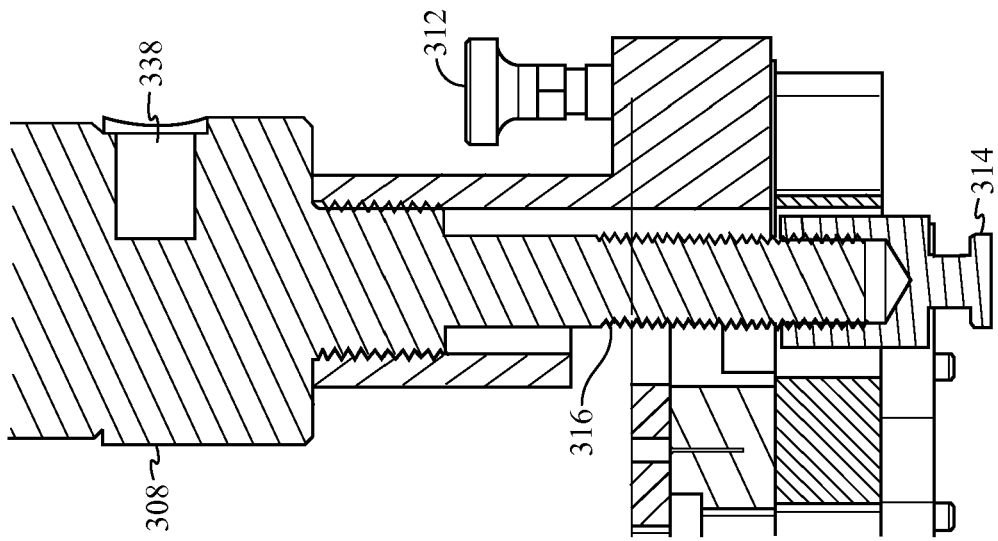
FIG. 13 is a cross sectional view of the actuator portion of the probe card actuator system of FIGS. 3-11 with the probe card frame removed.
Figure 14B:
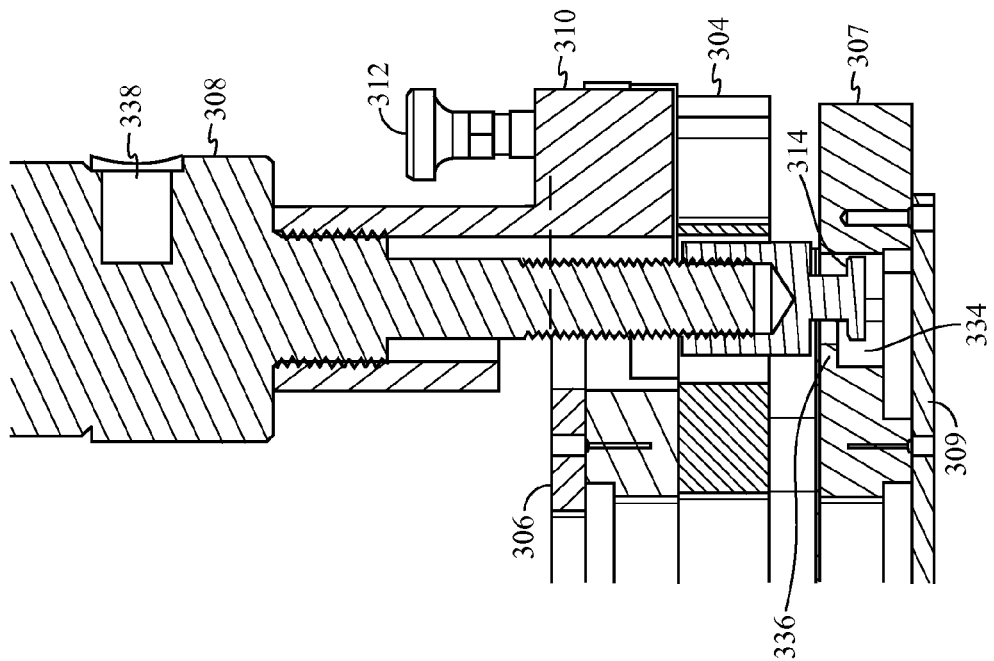
FIGS. 14A and 14B are cross sectional views of one of the actuator portions of the probe card actuator system of FIGS. 3-11 with the tip of the air cylinder engaged and disengaged, respectively, with the probe card frame.
Figure 14A:
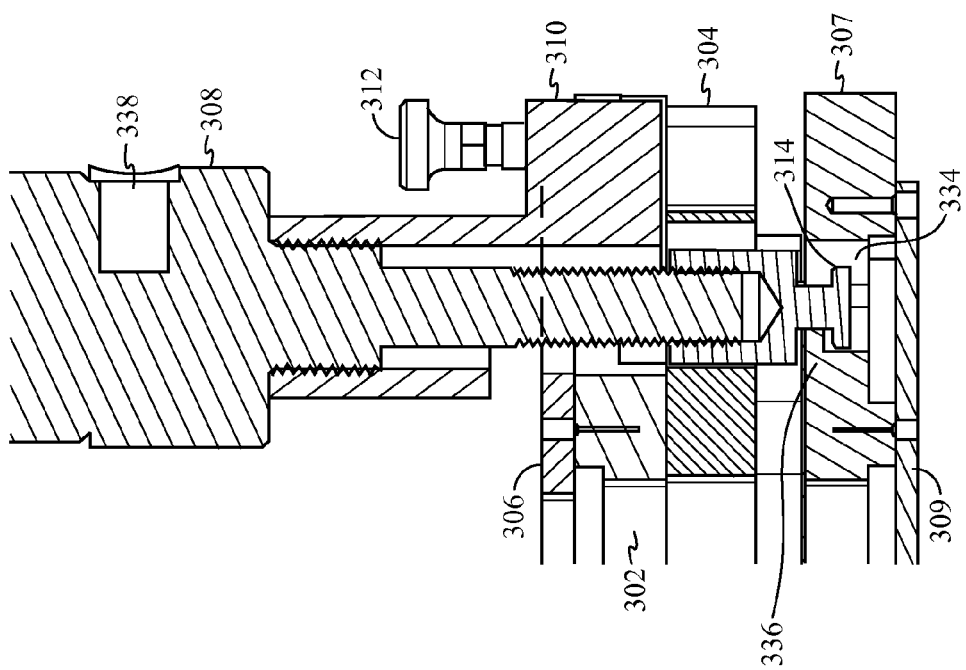

Details of the actuators 308, the blocks 310 and the actuator tips 314 will be discussed in reference to FIGS. 9-14. FIGS. 9 and 10 are underside perspective views of the tip 314 of the actuators 308 of the probe card actuation system 300. FIG. 11 is a cross sectional view of two of the actuators 308. FIGS. 12 and 13 are a perspective view and a cross sectional view of the actuators 308 (and other connected hardware) removed from the actuator system 300. FIGS. 14A and 14B are cross sectional views of one of the actuators 308 showing the tip 314 in an engaged position and in a disengaged position, respectively.

In FIGS. 9, 11 and 14A, the tip 314 is shown in an engaged state where the block 310 that the actuator 308 is mounted on is pushed inward such that one of the spring loaded lock plungers 312 has locked the tip 314 so as to engage a lip 336 of the lower frame 307. The tip 314 is positioned in a hole 334 formed in the lower frame 307. In FIGS. 10 and 14B, the tip 314 is shown in the unlocked position where the lock plunger 312 has been pulled up allowing the spring of the actuator 308 to force the block 310 to the outer position thereby disengaging the tip 314 from the lip 336 of the lower frame 307. When all four of the actuators 308 are in the unlocked position as shown in FIG. 10, the upper portion of the actuator system 300 (including the actuators 308, the upper frame 302 and probe tower 304 can be lifted off of the lower frame 307 without using any tools.

In reference to FIG. 11, both of the actuators 308 are shown in the engaged position where the tip 314 is locked under the lip 336. The actuators 308 include an air intake 338 and an exhaust muffler 340. When the actuators are all in the locked position, pressurized air is supplied to the air intake 338 which forces a piston (not shown) in the actuator 308 to move upward, thereby pulling the tip 314 against the lip 336 and forcing the electrical contacts of the lower frame 307 to contact and compress the probe needles of the probe blocks 318. When the air pressure is removed, the compressed needles of the probe blocks 318, the support spring plungers 322, and return springs in the actuators 308 raise the upper portion away from the lower frame 307. Actuators 308 including a return spring are used in this embodiment, but other embodiments could use dual acting actuators 308 including two air intakes.

In the embodiment illustrated in FIGS. 9-14, the tips 314 are circular. However, other embodiments could have other shaped tips. The circular tips were chosen because of the limited area available in this embodiment. The tips are made of stainless steal in this embodiment.

In the embodiment in FIGS. 3-14, the actuators 308 are 1.5 inch bore air cylinders. These air cylinders provide 136 lbs. of force each for a total force of 544 lb. when provided with an air pressure of 80 psi. These air cylinders were chosen to overcome actuation forces including 1) probe needle compression forces of 1.86 ounces for 2000 probe needles or about 233 lb., 2) support spring plunger compression forces of 44.4 lb. (11.1 lb. each for four support spring plungers 322), and actuator return spring compression forces of 68 lb. (17 lb. for each of the air cylinder actuators 308) for a total of about 346 lb. of compression. Thus, the 1.5 inch bore air cylinders provide a safety margin of 1.57 (544/346). A safety margin in the range of about 1.5 to 2.0 is usually sufficient. Alternatives to air cylinder actuators that can also be used include magnetic actuators, gas actuators, liquid actuators, etc.

The four air cylinder actuators 308 are connected, via the air intakes 338 and four air hoses (not shown) to a common air supply capable of providing 80 psi. The air hoses are preferably of equal length so that all the air cylinders actuate at about the same rate. With equal length hoses and a common air supply, the only difference in actuation times between the air cylinders should be a result of the manufacturing tolerances of the air cylinders. A control box can be coupled to the air supply to turn the air supply on and off, thereby actuating and de-actuating the air cylinders.

The actuator system 300 shown in FIGS. 3-14 includes 10 probe blocks 318 arranged in two rows, similar to the configuration shown in FIGS. 2A and 2B above. The actuators 308 are arranged symmetrically around the probe blocks 318. This symmetry assures that equal forces are provided to each of the probe blocks. Because equal forces are applied, the probe needles are compressed at the same rate and tilting of the probe tower 304 relative to the lower frame 307 is prevented. Tipping of the probe tower 304 relative to the lower frame 307 could damage the probe needles and or the lower CCA 309.

The actuators 308 and the corresponding blocks 310 upon which the actuators 308 are mounted can be locked in place independently. If the actuators are actuated when some, but not all, of the actuators 308 are locked to engage the lower frame 307, the probe needles and/or the lower CCA could be damaged due to rotation of the support frames. It may be desirable to include sensors on the blocks 310 to detect and provide an indicator signal when all four actuator assemblies are locked into place. The indicator signal could be a red light when one or more of the actuators 308 is not locked to engage the lower frame 307 and it could change to a green light when all the actuators 308 are locked to engage the lower frame 307. In this way, damage to the probe needles could be avoided. The indicator signal could also be coupled to the control box to disable the on/off switch such that the air supply is not able to be activated if all four actuators 308 are not locked to engage the lower frame 307.

Other configurations of probe blocks 318 and actuators 308 are also possible. For example, FIGS. 15A-15D illustrate various configurations of actuator systems including various probe block patterns and actuator locations. The configuration illustrated in FIG. 15A includes three probe blocks 318 and three actuators 308. The actuators 308 are positioned symmetrically relative to the three probe blocks 318. The configuration of FIG. 15A includes a circular probe card circuit area 212 that includes a core socket 214.

Figure 15A:
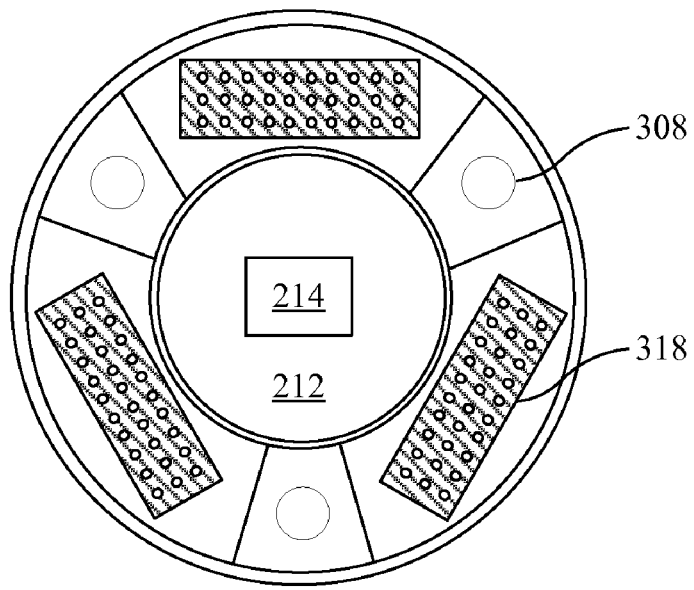
FIGS. 15A, 15B, 15C and 15D illustrate various configurations of actuator systems including various probe block patterns and actuator locations.
Figure 15B:
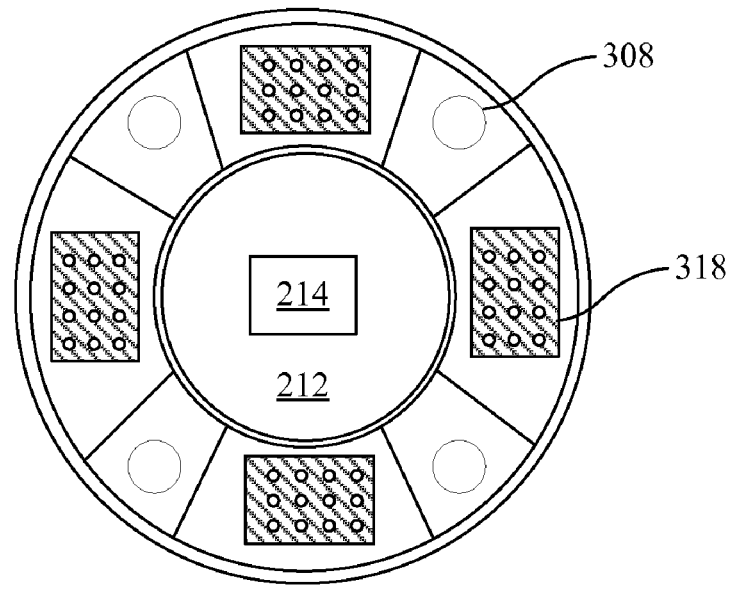

The actuator configuration illustrated in FIG. 15B is another circular configuration include four probe blocks 318 and four actuators 308. Once again, the actuators 308 are positioned symmetrically relative to the probe blocks 318.

Figure 15C:
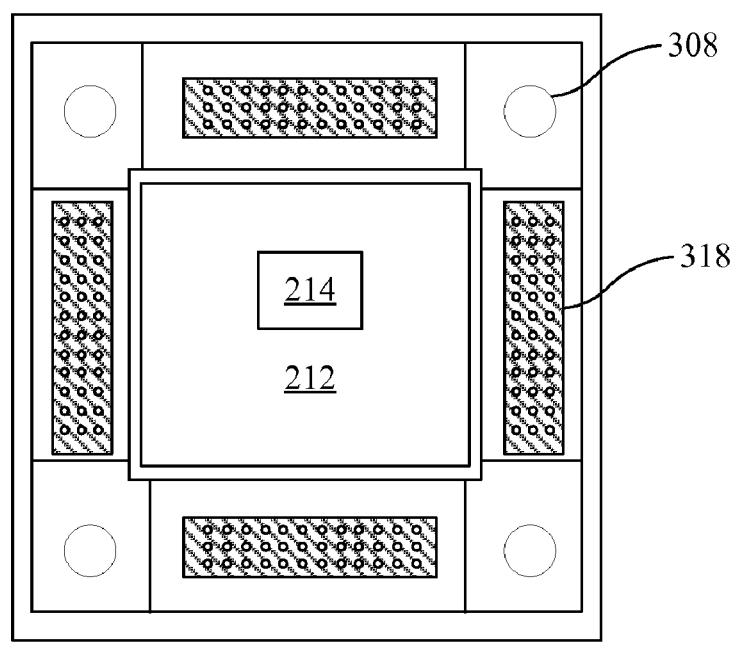

The actuator configuration illustrated in FIG. 15C is a square configuration that includes four probe blocks 318 and four actuators 308. Symmetry is again maintained by the configuration of actuators 308 and the probe blocks 318. The probe card circuit area is also square in the configuration of FIG. 15C.

Figure 15D:
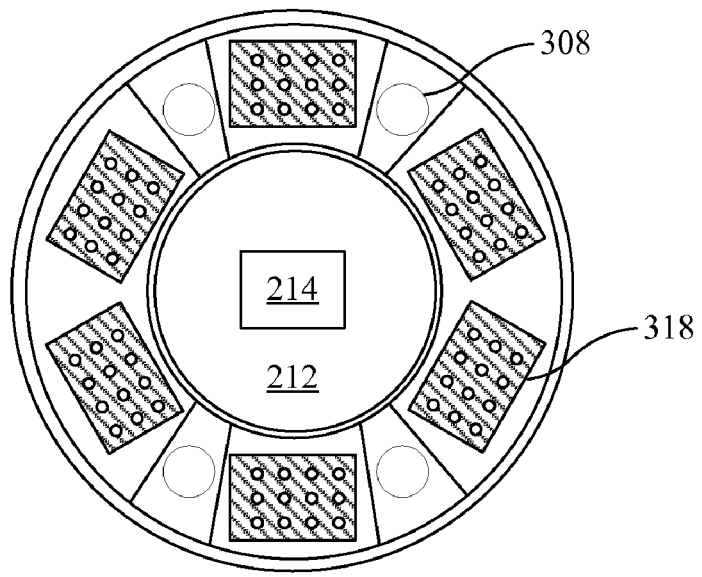

FIG. 15D illustrates another circular configuration with six probe blocks 318 and four actuators 308. This configuration differs from the circular configuration of FIG. 15B in that the actuators 308 are not equally spaced at 90 deg. intervals, but are skewed closer to one axis. This is done to again maintain symmetry between the actuator locations and the locations of the probe blocks 318. Other configurations including different numbers and patterns of probe blocks 318 and different numbers and patterns of actuators 308 are also possible.

Figure 16:
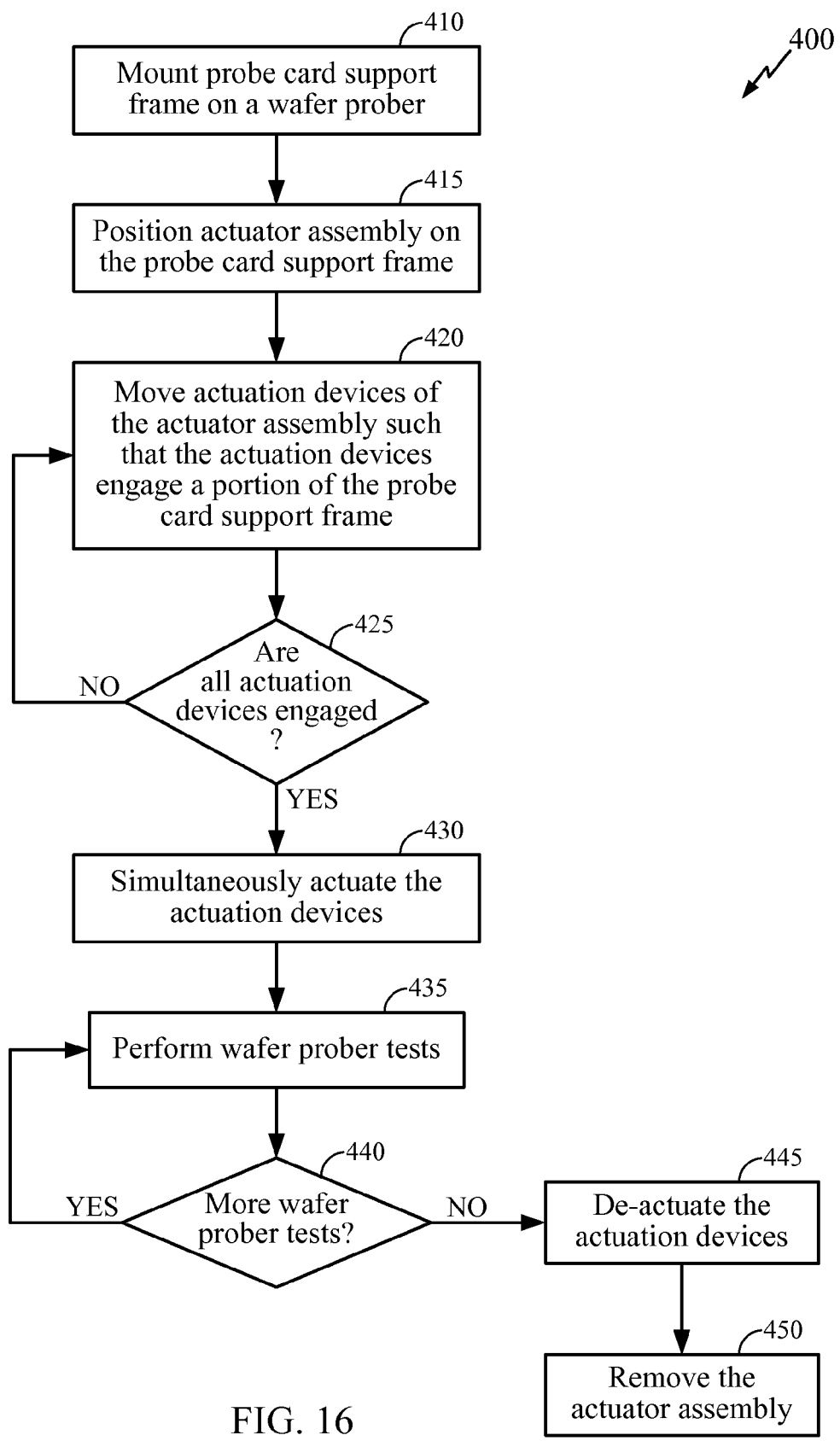
FIG. 16 is a flowchart of an embodiment of a process of probe testing a semiconductor wafer using the probe card actuator system of FIGS. 3-14.

FIG. 16 is a flowchart of an embodiment of a process 400 of probe testing a semiconductor wafer using the probe card actuator system 300 of FIGS. 3-14. The process 400 can be performed using the probe card actuator system 300 with the wafer prober system 100 illustrated in FIG. 1. The process 400 starts at block 410 where a probe card support frame is mounted on a wafer prober, e.g., the lower frame 307 of the probe actuator system 300 can be mounted on the test table 112 of the wafer prober 102. The lower frame 307 is secured to the test table 112 using the clamps 305.

The probe card support frame can include any of the support frame configurations discussed above, such as the support frame 202 of FIG. 2A, the lower frame 307 of FIGS. 3-14, or the configurations shown in FIGS. 15A-15D. The probe card support frame is configured to support a probe card CCA (e.g., the circuit card assembly 212) as well as a plurality of electrical contacts (e.g., the contact points 208 of the probe receptor blocks 206) coupled to circuitry of the probe card CCA.

After mounting the lower frame 307 on the test table 112, the process 410 proceeds to block 415, where a probe card actuator assembly, e.g., the probe card actuator system 300, is positioned on the lower frame 307. In the example system 300, the upper portion of the actuator system 300 including the upper frame 302, the probe tower 304, the actuators 308 and associated hardware is positioned on the lower frame 307, and guided by the dowel pins 324 and 326, such that the actuator tips 314 are inserted into the holes 334 of the lower frame 307. The upper frame 302 supports the test interface CCA 306 that includes electrical contacts that are coupled to the probe needles of the probe blocks 318 included in the probe tower 304.

After positioning the actuator assembly on the probe card support frame at the block 415, the process 400 proceeds to block 420 where actuation devices of the actuator assembly are moved such that the actuation devices engage a portion of the probe card support frame. Using the probe card actuator system 300, the actuators 308 are moved inward at block 420 such that the actuator tips 314 of the actuators 308 engage the lip 336 of the lower frame 307. As discussed above, the actuators are then locked into the engaged position by the spring loaded lock plungers 312.

At block 425, a determination is made as to whether all the actuation devices are engaged. This determination is done to avoid damaging the probe needles and/or electrical contacts as discussed above. The determination at block 425 can be done manually by a user, or sensors can be used to indicate when all the actuation devices are engaged. The sensor system can be used to automatically prevent the actuation devices from being activated and causing the process 400 to return to block 420. Manual inspection can also be used at block 425 to determine when all the actuation devices are engaged, and manually repeat the moving steps at block 420 until all actuation devices are engaged.

Upon it being determined, at the block 425, that all the actuation devices are engaged, the process 400 continues to block 430, where all the actuation devices are actuated nearly simultaneously. Depending on the type of actuation devices, the near simultaneous activation can include application of an air pressure source, application of an electrical signal, application of an electromagnetic field, etc. The near simultaneous activation of the actuation devices can prevent damage to the probe needles and other hardware. In the probe card actuator system 300, actuating the actuators 308 moves the actuator tip 334 so as to pull on the lip 336 of the lower frame 307, thereby coupling the contact points of the lower frame 307 to the contact points of the test interface CCA attached to the upper frame 302. The lower frame 307 supports the electrical contacts so as to isolate the applied force resulting from actuation from the sensitive probe card circuit assembly 204, especially the probes of the core socket 214. The probe card circuit assembly 204 and the core socket 214 should experience little or no deflection during actuation since the cross members of the probe card frame absorb the large actuation forces.

After the actuation devices are actuated at the block 430, wafer prober tests are performed at block 435. The wafer prober tests can be performed on one or more integrated circuits that are formed on the wafer being tested. When tests are completed on one integrated circuit (or two), the process 400 continues to block 440. If more wafer prober tests are left to be done, e.g., more IC's on the wafer, the process continues from block 440 back to block 435 where the additional wafer tests are performed. If it is determined at the block 440 that no more wafer prober tests are to be performed, the process continues to block 445.

The determination at block 440 can also include a user determining that modifications to the probe card circuit assembly are desired or close examination of the IC's on the wafer are desired. In these cases, the user can decide to proceed to block 445.

At the block 445, the actuation devices are de-actuated. The de-actuation involves removal of the air pressure, removal of an electrical signal, and/or removal of a magnetic field, depending on what type of actuation devices are being used. The de-actuation can also include application of a second air pressure, electrical signal or magnetic field in the case of dual acting actuation devices.

After the actuation devices are de-actuated, the process continues to block 450, where the upper portion of the actuator assembly is removed from the probe card frame. Removal includes pulling the spring loaded lock plunger 312 upwards, thereby releasing and disengaging the actuators from the probe card frame, then lifting the upper portion of the actuator assembly off the probe card support frame. This allows access to the probe card CCA in order for modification and/or examination of the probe card CCA. The probe card frame and/or the core socket of the probe card CCA can be removed to allow examination of the IC's on the wafer, e.g., using a microscope. This ability to remove the upper portion of the probe card actuator assembly at any time during testing allows for fast examination and/or modification of the test hardware that is not provided by other test interfaces. The process 400 can be resumed, starting at block 410, after the modifications and/or examinations are finished. It should be noted that one or more of the blocks of the process 400 can be rearranged, combined, and/or omitted.

The embodiments of the probe card actuator system discussed in reference to FIGS. 2-14 included a probe tower with dual spring loaded probe needles that contacted female electrical contacts on both the upper test interface CCA and the lower probe card CCA. Other configurations including probe needles on the upper and lower CCA's and/or female electrical contacts on the probe tower, female contacts on the upper CCA or the lower CCA combined with probe needles on the other CCA (without an intermediate probe tower) can also be used.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Persons of ordinary skill in the art may implement the described functionality in varying ways for each particular application, but such implementation decisions should not be interpreted as causing a departure from the scope of the disclosure.

The various illustrative logical blocks, modules, and circuits described in connection with the embodiments disclosed herein may be implemented or performed with a general purpose processor, a digital signal processor (DSP), a Reduced Instruction Set Computer (RISC) processor, an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration.

The steps of a method, process, or algorithm described in connection with the embodiments disclosed herein may be embodied directly in hardware, in a software module executed by a processor, or in a combination of the two. A software module may reside in RAM memory, flash memory, non-volatile memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. Further, the various methods may be performed in the order shown in the embodiments or may be performed using a modified order of steps. Additionally, one or more process or method steps may be omitted or one or more process or method steps may be added to the methods and processes. An additional step, block, or action may be added in the beginning, end, or intervening existing elements of the methods and processes.

The above description of the disclosed embodiments is provided to enable any person of ordinary skill in the art to make or use the disclosure. Various modifications to these embodiments will be readily apparent to those of ordinary skill in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. A probe card test interface, comprising:
a first frame configured to support a probe card circuit card assembly (CCA), the probe card CCA being configured to contact a semiconductor wafer with one or more test probes, the first frame being further configured to support a first group of electrical contact points, the first group of electrical contact point being electrically coupled to circuitry of the probe card CCA, wherein the first frame includes at least one lip;
a second frame coupled to a test interface CCA, the test interface CCA including a second group of electrical contact points, and
a plurality of actuation devices, the actuation devices being slidably mounted on the second frame, wherein the actuation devices have a tip member configured to engage the at least one lip of the first frame when the corresponding actuation device is moved to an engagement position, wherein, when the plurality of actuation devices are in the engagement position, actuation of the plurality of actuation devices moves the first frame toward the second frame to couple the first and second groups of electrical contact points.

2. The probe card test interface of claim 1, wherein the first group of electrical contact points is supported by the first frame such that the probe card CCA experiences little or no deflection during actuation of the actuation devices.

3. The probe card test interface of claim 1, further comprising a plurality of dowel pins configured to align the first group of electrical contact points with the second group of electrical contact points such that the first and second groups of electrical contact points couple together during actuation of the actuation devices.

4. The probe card test interface of claim 1, further comprising a plurality of spring plungers extending from a surface of the second frame and configured to contact a surface of the first frame to support the second frame at a distance from the first frame when the plurality of actuation devices are not providing an actuation force.

5. The probe card test interface of claim 1, wherein the second frame is mechanically coupled to a probe tower frame between the first frame and the second frame, the probe tower frame configured to support a group of electrical probes, the electrical probes being configured to couple the first group of contact points and the second group of contact points upon actuation of the plurality of actuation devices.

6. The probe card test interface of claim 1, wherein the plurality of actuation devices are configured to provide a force sufficient to overcome forces needed to couple the first group of electrical contacts and the second group of electrical contacts.

7. The probe card test interface of claim 1, wherein each of the plurality of actuation devices are connected to a first spring, wherein the first spring is configured to move the tip member of the actuation device so as not to engage the at least one lip of the first frame.

8. The probe card test interface of claim 7, wherein each actuation device further comprises a spring loaded lock plunger, wherein the spring loaded lock plunger is coupled to a spring configured to move a tip of the spring loaded lock plunger into a hole of the second frame when the actuation device is moved to the engagement position, thereby preventing the first spring of the actuation device from moving the tip member of the actuation device so as not to engage the at least one lip.

9. The probe card test interface of claim 1, wherein the test interface CCA includes input output (I/O) adapters electrically coupled to the second group of electrical contact points, the I/O adapters being configured to be connected to at least one cable.

10. A wafer prober system configured to mount the probe card test interface of claim 9, the wafer prober system be configured to supply input test signals to and receive output signals from the I/O adapters.

11. A probe card test interface, comprising:
a first frame configured to support a probe card circuit card assembly (CCA), the probe card CCA being configured to contact a semiconductor wafer with one or more test probes, the first frame being further configured to support a first group of electrical contact points, the first group of electrical contact point being electrically coupled to circuitry of the probe card CCA, wherein the first frame includes at least one lip;

a second frame coupled to a test interface CCA, the test interface CCA including a second group of electrical contact points, and a plurality of actuation devices, the actuation devices being slidably mounted on the second frame, wherein the actuation devices have a tip member configured to engage the at least one lip of the first frame when the corresponding actuation device is moved to an engagement position, wherein, when the plurality of actuation devices are in the engagement position, actuation of the plurality of actuation devices moves the first frame toward the second frame to couple the first and second groups of electrical contact points;

wherein the test interface CCA includes input output (I/O) adapters electrically coupled to the second group of electrical contact points, the I/O adapters being configured to be connected to at least one cable;

the wafer prober system being configured to supply input test signals to and receive output signals from the I/O adapters;

wherein the plurality of actuation devices are spring loaded air cylinders, the wafer prober system further comprising a common air supply connected to air intakes of the spring loaded air cylinders, wherein the spring loaded air cylinders move the first and second frames to couple the first and second groups of electrical contacts in response to an input air supply, and springs of the spring loaded air cylinders decouple the first and second groups of electrical contacts when the air supply is removed.

12. A method of probe testing a semiconductor wafer, the method comprising:
mounting a first frame on a wafer prober system, the first frame configured to support a probe card circuit card assembly (CCA), the probe card CCA being configured to contact a semiconductor wafer with one or more test probes, the first frame being further configured to support a first group of electrical contact points, the first group of electrical contact point being electrically coupled to circuitry of the probe card CCA, wherein the first frame includes at least one lip;

positioning a second frame on the first frame, the second frame being coupled to a test interface circuit card assembly, the interface circuit card assembly comprising a second group of electrical contact points, the second frame coupled to a plurality of actuation devices, the actuation devices being slidably mounted on the second frame, wherein the actuation devices comprise a tip member configured to engage the at least one lip of the first frame when the corresponding actuation device is moved to an engagement position;

moving each of the actuation devices into the engagement position; and when the plurality of actuation devices are in the engagement position, simultaneously actuating the plurality of actuation devices to move the first frame toward the second frame to couple the first and second groups of electrical contact points.

13. The method of claim 12, further comprising:
de-actuating the plurality of actuation devices;
moving the actuation devices out of the engagement position; and
removing the actuator assembly from the first frame.

14. The method of claim 12, wherein the first group of electrical contact points is supported by the first frame such that the probe card CCA experiences little or no deflection during actuation of the actuation devices.

15. An apparatus for probe testing a semiconductor wafer, the apparatus comprising:
first supporting means for supporting a probe card circuit card assembly, the first supporting means further for supporting a first group of electrical contact points, the first group of electrical contact point being electrically coupled to circuitry of the probe card circuit card assembly (CCA), the probe card CCA being configured to contact a semiconductor wafer with one or more test probes;
means for mounting the first supporting means on a wafer prober system;
second supporting means for supporting a test interface circuit card assembly, the test interface circuit card assembly comprising a second group of electrical contact points;
means for aligning the second supporting means with the first supporting means; and
actuation means for releasably engaging the first supporting means and for moving the first supporting means toward the second supporting means to couple the first and second groups of electrical contact points.

16. The apparatus of claim 15, wherein the first supporting means comprises a frame.

17. The apparatus of claim 15, wherein the means for aligning comprises a plurality of dowel pins.

18. The apparatus of claim 15, wherein the second supporting means comprises a frame.

19. An apparatus for probe testing a semiconductor wafer, the apparatus comprising:
first supporting means for supporting a probe card circuit card assembly, the first supporting means further for supporting a first group of electrical contact points, the first group of electrical contact point being electrically coupled to circuitry of the probe card circuit card assembly (CCA), the probe card CCA being configured to contact a semiconductor wafer with one or more test probes;
means for mounting the first supporting means on a wafer prober system;
second supporting means for supporting a test interface circuit card assembly, the test interface circuit card assembly comprising a second group of electrical contact points;
means for aligning the second supporting means with the first supporting means; and
actuation means for releasably engaging the first supporting means and for moving the first supporting means toward the second supporting means to couple the first and second groups of electrical contact points;
wherein the actuation means comprises a plurality of air cylinder actuators.

20. The apparatus of claim 15, wherein the first group of electrical contact points is supported by the first supporting means such that the probe card circuit assembly experiences little or no deflection during actuation of the actuation means.

* * * * *